United States Patent
Tao et al.

(10) Patent No.: US 6,921,946 B2
(45) Date of Patent: Jul. 26, 2005

(54) TEST STRUCTURE FOR ELECTRICAL WELL-TO-WELL OVERLAY

(75) Inventors: Guoqiao Tao, Nijmegen (NL); Roy Arthur Colclaser, Albuquerqu, NM (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 276 days.

(21) Appl. No.: 10/320,266

(22) Filed: Dec. 16, 2002

(65) Prior Publication Data

US 2004/0113147 A1 Jun. 17, 2004

(51) Int. Cl.$^7$ .............................................. H01L 29/00
(52) U.S. Cl. ...................... 257/355; 257/524; 257/499
(58) Field of Search .................. 257/355, 524–526, 257/499, 505, 511, 565, 513–520, 648–650, 378, 344, 48, 335, 283, 336, 341–346, 262, 339, 370, 413, 412; 438/14–18

(56) References Cited

U.S. PATENT DOCUMENTS

| | | | | |
|---|---|---|---|---|
| 5,065,219 A | * | 11/1991 | Terashima ................... | 257/524 |
| 5,100,814 A | * | 3/1992 | Yamaguchi et al. ........ | 438/234 |
| 5,304,827 A | * | 4/1994 | Malhi et al. ................. | 257/262 |
| 5,841,169 A | * | 11/1998 | Beasom ....................... | 257/355 |
| 6,060,742 A | * | 5/2000 | Chi et al. .................... | 257/316 |
| 6,221,681 B1 | * | 4/2001 | Sugasawara ................. | 438/14 |
| 6,359,318 B1 | * | 3/2002 | Yamamoto et al. ......... | 257/378 |
| 6,424,005 B1 | * | 7/2002 | Tsai et al. .................... | 257/335 |
| 6,545,337 B2 | * | 4/2003 | Takada et al. .............. | 257/499 |
| 6,617,643 B1 | * | 9/2003 | Goodwin-Johansson .... | 257/335 |
| 6,784,490 B1 | * | 8/2004 | Inoue et al. ................. | 257/344 |

* cited by examiner

Primary Examiner—Laura Schillinger
(74) Attorney, Agent, or Firm—Peter Zawilski

(57) ABSTRACT

There is a test structure on a semiconductor substrate for testing misalignment between adjacent implanted regions of opposite conductivity in a semiconductor device. In an example embodiment, the test structure includes a first and a second triple well structure; the second triple well structure is adjacent to the first triple well-structure in a first direction. Each structure includes a lower buried n-well region, a p-well region, a p$^+$-region, an n-well region and a base n$^+$-region, wherein a central base portion and a central n-well region portion are common to the first and the second structure, with the central base portion as a symmetry line with a width. Between the central base portion and the p-well region in the first triple well-structure a first overlay, and between the central base portion and the p-well region in the second triple well-structure a second overlay is provided.

6 Claims, 3 Drawing Sheets

TEST STRUCTURE FOR ELECTRICAL WELL-TO-WELL OVERLAY

The present invention relates to a testing structure for testing misalignment of adjacent implanted regions of opposite conductivity type in a semiconductor device according to the preamble of claim 1. Also, the present invention relates to a method for manufacturing such a test structure. Further, the present invention relates to a test arrangement comprising a plurality of such test structures. Moreover, the present invention relates to a semiconductor device comprising such a test structure. Furthermore, the present invention relates to a method for testing misalignment of adjacent implanted regions of opposite conductivity type using such a test structure.

In the manufacturing of semiconductor devices often an implantation process is used to define especially doped regions in the semiconductor substrate, such as in triple well-structures where a bipolar transistor structure (for example, PNP) is present. The ion implantation process modifies the electrical characteristics of the region which is exposed to the implantation by the implantation mask due to the incorporation of particles from the implantation beam in the substrate: due to the energy exchange between the particles from the implantation beam and the substrate an implanted region with modified characteristics is formed (in the following this will be referred to as "implanted device region").

In well-structures, however, a number of implanted device regions typically of mutually opposite conductivity types may be stacked to form a implanted device region which is decoupled from the substrate. Also, this decoupled implanted device region must be confined at it's sidewalls to prevent a short or punch-through to the semiconductor substrate. This confinement can be achieved by an adjacent implanted region having the opposite conductivity type relative to the conductivity type of the decoupled region. The alignment of such adjacent regions must be accurate to prevent the above mentioned short or punch-through. Since no optically observable features of an implanted region in a substrate exist (one can not see such an region), successful alignment is a critical step and can be detected only after completely processing the well-structure.

Moreover, the alignment may vary as a function of die location on a semiconductor wafer, thus an evaluation of alignment from die to die is needed. Also, due to the plurality of tests to be carried out on the wafer level, a testing method for a quick and straightforward test is needed here.

From Japanese patent 09-129750 (Tsutomu) a method is known to measure and evaluate the alignment deviation of a mask between a well and an element separating region. This method focuses on the manufacturing of wells of similar conductivity types and does not address the problem of evaluating alignment of an implanted structure (possibly stacked) with an adjacent implanted region.

From U.S. Pat. No. 6,135,892 (Ohsono) a semiconductor device is known which contains check elements to check a junction withstand voltage of the semiconductor. The junction voltage measurement relates to determination of the state of the formation of a P-channel barrier region directly below a field oxide. In the semiconductor device according to U.S. Pat. No. 6,135,892 a contact between N-type diffusion region and P-type channel barrier region is measured electrically for this purpose. The alignment deviation is evaluated by subsequent measurements of a plurality (four) of N-type diffusion regions, "because of the constitution wherein four N-type diffusion layers are formed so as to be isolated and each contact an edge of the P-type channel barrier region, and each electrode is drawn from one of the four N-type diffusion layers". This device from the prior art does not address the problem of evaluating alignment of an implanted structure with an adjacent implanted region.

It is an object of the present invention to provide a test structure and a method for evaluation of relative alignment of adjacent implanted regions of opposite conductivity type in a semiconductor device. The present invention relates to a test structure as defined in the preamble of claim 1, characterized in that in the test structure a central portion of the base and a central portion of the high voltage n-well region are common to the first and the second triple well-structure, the second triple well-structure being mirrored in the first direction relative to the first triple well-structure using the central portion of the base as a symmetry line running in a second direction perpendicular to the first direction, the symmetry line having a width and between the central portion of the base and the high voltage p-well region in the first triple well-structure a first overlay distance in the first direction is provided, and between the central portion of the base and the high voltage p-well region in the second triple well-structure a second overlay distance in the first direction is provided.

Also, the present invention relates to a method for manufacturing such a test structure.

Advantageously, the test structure according to the present invention is compatible with standard technology and can be easily incorporated within a semiconductor device.

Moreover, the present invention relates to a semiconductor device comprising such a test structure.

Further, the present invention relates to a test arrangement comprising a plurality of such test structures. In the present invention, the test arrangement as defined in the preamble of claim 4 is characterized in that the first set being arranged for testing misalignment in a first test direction, the first test direction being substantially parallel to the first direction, the set comprises at least a first test structure, a second test structure and a third test structure, the first direction of each of the at least first test structure, second test structure and third test structure being substantially parallel to the first test direction, the first test structure having first values for the overlay distances, the second test structure having second values for the overlay distances, the third test structure having third values for the overlay distances.

By the test arrangement according to the present invention, the quality of alignment between adjacent implanted regions of opposite conductivity can be checked by simple electric measurement of bipolar characteristics of each test structure. A further comparison of results for each test structure substantially quantifies the misalignment within the semiconductor device wherein the test arrangement is incorporated.

Furthermore, the present invention relates to a method for testing misalignment of an overlay of adjacent implanted regions of opposite conductivity type using such a test structure.

For the purpose of teaching of the invention, preferred embodiments of the method and devices of the invention are described below. It will be appreciated by the person skilled in the art that other alternative and equivalent embodiments of the invention can be conceived and reduced to practice without departing form the true spirit of the invention, the scope of the invention being limited only by the appended claims.

Figure 1:
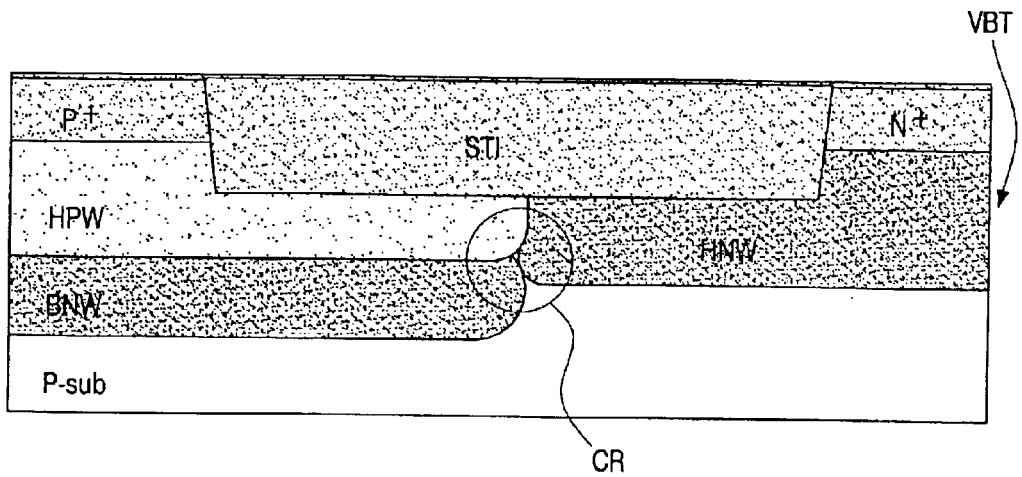
FIG. 1 shows a schematic diagram of a cross-section of a vertical pnp bipolar transistor.

FIG. 1 shows a schematic diagram of a cross-section of a vertical pnp bipolar transistor VBT. The vertical bipolar transistor VBT according to the prior art, is arranged on a p-doped semiconductor silicon substrate P-SUB and comprises on the substrate a lower buried n-well region BNW having an n-type conductivity. On top of the BNW region a high voltage p-well region HPW having a p-type conductivity is located, which occupies a substantially equal area size as the BNW region. Finally, on top of the HPW region a $p^+$-region P+ is arranged. In the substrate P-SUB, laterally adjacent to the HPW region a high voltage n-well region HNW is present, on top of which a $n^+$-region N+ is located. At the surface of the transistor VBT, the $n^+$-region N+ and $p^+$-region P+ are isolated from each other by an isolation region, preferably a shallow trench isolation STI. In the structure of FIG. 1, the stack comprising the BNW, HPW and P+ regions functions as emitter E of the transistor VBT, the stack of the HNW and N+ region acts as base B of the transistor VBT. The substrate P-SUB acts as collector C. In the transistor VBT the HPW region is to be isolated electrically from the substrate P-SUB by the BNW region and the adjacent HNW region. In particular, a critical region is present as indicated by the circle CR. In this critical region CR a short or "punch-through" may occur if the BNW and HNW regions do not shield the HPW sufficiently from the substrate P-SUB.

In the process (device) technology generation of 0.18 $\mu$m, typical dimensions are: for the HPW: 0.9 $\mu$m (range from 0.3 to 3.0 $\mu$m), for the BNW: 0.8 $\mu$m (range from 0.3 $\mu$m to 0.5 $\mu$m), and for the HNW: 1.4 $\mu$m (range from 0.5 to 5 $\mu$m). It is noted that the present invention can be applied in process technology generations ranging from 0.7 $\mu$m to (future) 0.06 $\mu$m.

During manufacturing, the alignment of the implantation steps to form the respective regions relative to each other determines the quality of the pnp transistor VBT. In other words, successful alignment of the regions is a critical step. A region with n-type conductivity is implanted with a donor type element such as P or As. A region with p-type conductivity can be created using B as dopant.

Disadvantageously, an implanted region in a substrate can not be observed visually, at least not in a non-destructive manner. The quality of the alignment can be detected by electrical measurement only after completely processing the transistor VBT.

In the present invention it is recognized that in a vertical pnp bipolar transistor the bipolar characteristics, e.g., amplification factor $\beta$ (i.e. collector current $I_C$ divided by base current $I_B$) and collector current $I_C$ and/or other transistor parameters (e.g., the emitter current $I_E$) are dependent on the overlay of the adjacent implanted regions which have a mutually opposite conductivity type. Also, the bipolar characteristics show a different dependence on the sign of the overlay, either being positive (i.e. an overlap of implanted regions) or negative (i.e. a gap between implanted regions). This effect will be explained in more detail with reference to FIG. 4.

Figure 2:
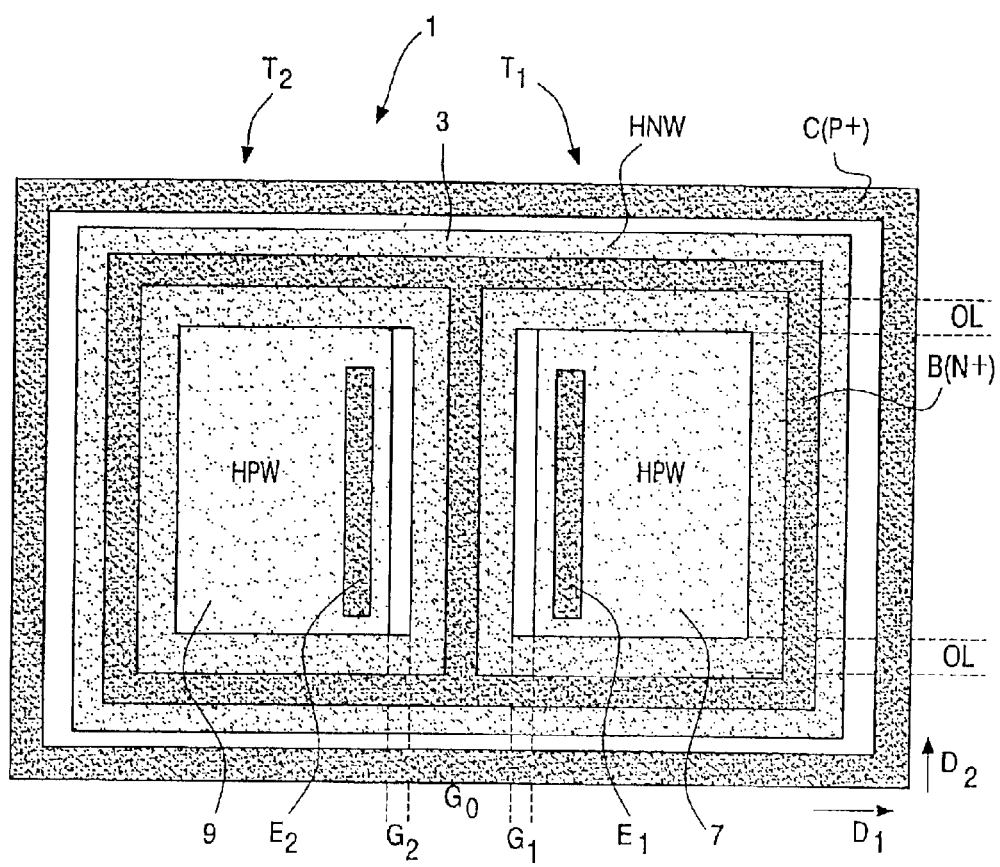
FIG. 2 shows a top view of a test structure according to the present invention for evaluating misalignment of adjacent implanted regions.

FIG. 2 shows a top view of a test structure according to the present invention for evaluating misalignment of adjacent implanted regions.

The test structure according to the present invention consists of a pair of a first and a second vertical pnp bipolar transistors T1, T2, which transistor pair is shown in the FIG. 2. The transistor pair comprises a common p+ collector C (in the substrate), a common HNW region 3 and a common n+ base B, a first HPW region 7, a second HPW region 9, a first p+ emitter E1, a second p+ emitter E2. Under first and second HPW regions respective BNW regions are located (not shown).

The first transistor T1 consists of the common collector C, the common base B and the first emitter E1. The second transistor T1 consists of the common collector C, the common base B and the second emitter E2. The test structure has a substantially rectangular area, having a width and a length. In the length direction the first and second transistors are placed adjacent to each other, with a gap G in between. The common collector C is located at the circumference of the test structure 1. The common base B is divided in a central portion in between T1 and T2, a first outer portion between T1 and collector C and second portion between T2 and collector C. The gap G in the central region of the test structure consists of a width G0 of a free central portion of the common base B, a width G1 and a width G2, which form an overlay length of the first transistor T1 and second transistor T2, respectively, with the central portion of the HNW region. The test structure 1 will be explained in more detail with reference to FIG. 3.

Figure 3:
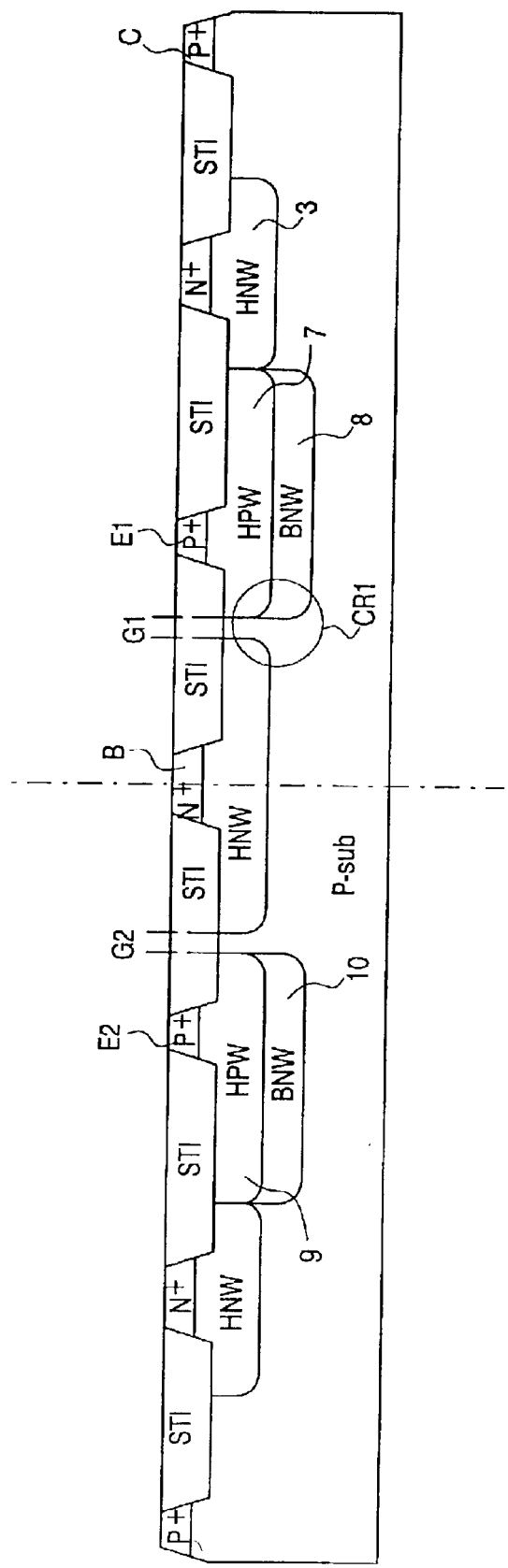
FIG. 3 shows a cross-sectional view of the test structure according to the present invention shown in FIG. 2.

FIG. 3 shows a cross-sectional view of the test structure 1 according to the present invention shown in FIG. 2.

In FIG. 3 entities with the same reference number refer to the same entities as shown in FIGS. 1 and 2.

In the substrate P-SUB, under the first HPW region 7 a first lower buried n-well region BNW 8 is located to isolate the first HPW region 7 from the substrate P-SUB in the vertical direction.

Similarly, a second lower buried n-well region BNW 10 is located in the substrate P-SUB under the second HPW region 9 to isolate the second HPW region 9 from the substrate P-SUB.

In between the central portion of common base B and first emitter E1, the first outer portion of common base B and first emitter E1, the central portion of common base B and second emitter E2, the second outer portion of common base B and second emitter E2, and in between common base and common collector C shallow trench isolation regions, all denoted as STI, are present.

In FIG. 3 overlays G1 and G2 are shown, each as a gap with an open region in between the common HNW region and the first BNW region 8 and the second BNW region 10, respectively. These open regions constitute critical regions CR1 and CR2 to an electrical short or "punch-through" as already explained with reference to FIG. 1.

The test structure 1 shown in FIGS. 2 and 3 is manufactured simultaneously with the manufacturing of the implanted device regions of which the overlay is to be evaluated, using the same implantation and lithographical processes as for the implanted device regions. Persons skilled in the art will appreciate that the test structure 1 as shown in FIGS. 2 and 3 will be provided with further metallisation and passivation structures (not shown here) during back-end processing.

In the test structure 1 the overlays G1 and G2 are defined as overlays in one direction (in FIGS. 2 and 3 indicated by arrow A). To minimize influence from misalignment in other directions, the first and second emitters E1, E2 are located close to the respective critical region CR1 and CR2. Further, in a second direction D2, perpendicular to direction D1, secondary (positive) overlaps OL of the first HPW region 7 and the second HPW region 9 are designed relative to the common HNW region 3 to minimize the influence of alignment errors in that direction D2 on the electrical characteristics of the transistor T1 and T2, respectively.

The test structure according to the present invention is part of a test arrangement which comprises at least one series of test structures 1, all oriented in a single first test direction TD1 relative to the substrate and each having a different combination of overlays G1 and G2 in that first test direction TD1. The first test direction TD1 is parallel to the overlay direction D1.

Since misalignment may be different in different directions on a die, a further second series of test structures 1 may be available, in which all test structures 1 are oriented in a second test direction TD2 with the direction D1 of overlays G1 and G2 parallel to that second test direction TD2. Preferably, the second test direction TD2 extends perpendicular to the first test direction TD1.

According to the present invention, for each reticle (mask) area test arrangements are defined at one or more locations on the semiconductor wafer. Within each test structure of the arrangement each of the two overlays G1 and G2 are defined to have a certain pre-set value (actually an open space between the respective HNW and HPW regions).

The test structures are produced simultaneously with the actual implanted device regions for the semiconductor device. In this process, stepper masks are used in the creation of resist layers on the semiconductor substrate which will function as implantation masks. In the stepper masks for the actual implanted device regions the test structures are also defined with pre-set values for the overlays G1 and G2. After the processing to create the HPW and HNW regions in the test structure, the overlays G1 and G2 will comprise their respective pre-set value and possibly, a misalignment error caused by the processing sequence for implanting HPW and HNW regions. The evaluation of electrical measurements on the test structures to determine the possible misalignment error will be explained later in more detail with reference to FIG. 4.

In the first test direction TD1 in each test structure 1 of a test arrangement, each pair of transistors T1 and T2 comprises a different combination of first and second overlays G1 and G2 in that first test direction TD1. A similar set-up is defined in the second test direction TD2. Table 1 illustrates a linear arrangement of 3 test structures 1, numbered I, II, III, with exemplary values of G1 and G2.

Table 1. overlay values G1 and G2 for transistors T1 and T2, respectively, in a test arrangement of three test structures I, II, III in a first or second test direction TD1, TD2.

| Test structure | G1 | G2 | G0 |
|---|---|---|---|
| I. | 0 | 2A | Y |
| II | A | A | Y |
| III | 2A | 0 | Y |

The width of the free central portion of the base B is taken constant as Y with Y chosen within a range from 0.5 to 10 $\mu$m. For instance, the width is chosen as Y=2 $\mu$m. The overlay within the individual test structures varies from zero to A, with A being between 0.1 and 1.0 $\mu$m, (for instance, for 0.4 $\mu$m, the gap G1 and G2 may each be zero, 0.4 or 0.8 $\mu$m). Secondary overlaps OL may have a value of e.g., 0.4 $\mu$m, also being the maximum overlap. It is noted that depending on the device generation and the accuracy of the processing equipment (e.g., stepper or mask aligner, implanter) different values for G1, G2 and G0 may be used.

Figure 4:
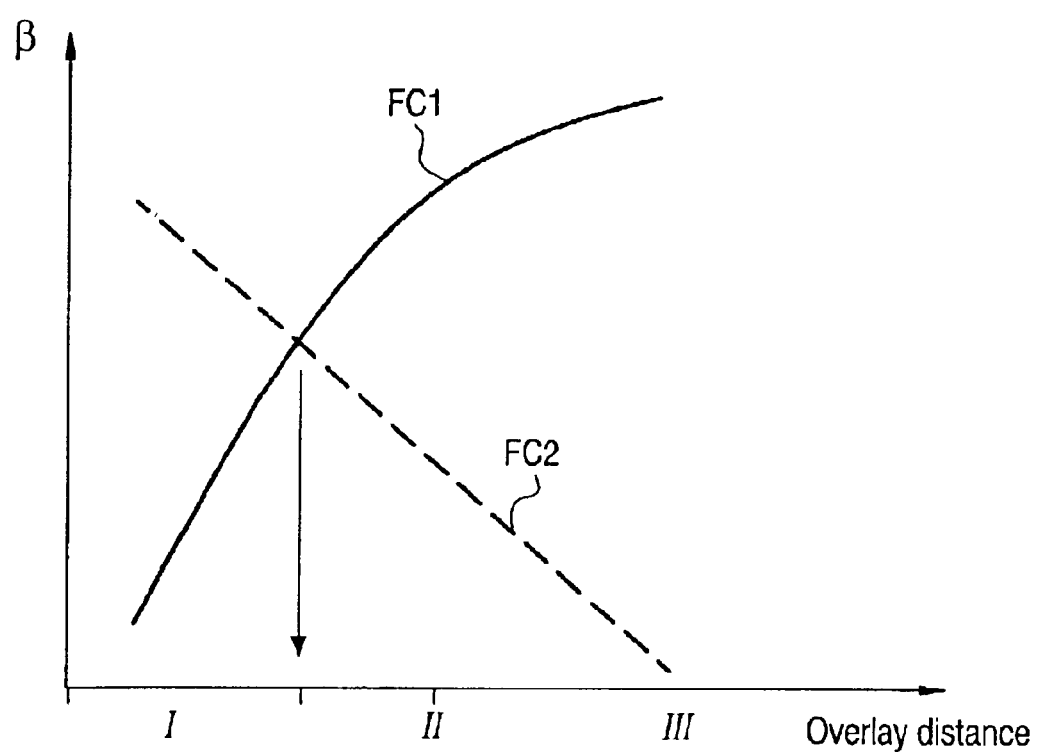
FIG. 4 shows an schematic diagram to be used by a method according to the present invention for evaluating a misalignment value.

FIG. 4 shows an schematic diagram to be used by a method according to the present invention for evaluating a misalignment value.

In the following it is assumed that a test arrangement consists of three test structure configurations I, II, and III, with overlay values as given in table 1. In FIG. 4 amplification factor $\beta$ (or e.g., collector current $I_C$) is plotted as a function of the overlay value in test structure I, II and III, for T1 transistors and for T2 transistors in each test structure in the test arrangement. For T1 transistors, a solid function curve FC1 is plotted. For T2 transistors, a dashed function curve FC2 is plotted. It is noted that for the purpose of the present invention the actual relation between $\beta$ (or $I_C$) and overlay value may be unknown. No assumptions are (needed to be) made with regard to the dependence of the electrical characteristics on the overlay value. It is further noted that in a similar way the emitter current $I_E$ can be used.

Since the overlay value changes differently for T1 relative to T2, the electrical characteristics of the transistors T1 and T2 will also change differently as a function of the respective overlay value in each test structure. Due to the difference in which the overlay value for T1 and T2 changes in an opposite direction as a function of the test structure I, II, III (as given in table 1), the change of electrical characteristics will also change substantially in opposite directions for T1 and T2. It is thus expected that at the intersection of the curve FC1 for T1 and the curve FC2 for T2 where T1 and T2 have substantially identical electrical characteristics, the overlay in T1 and T2 will be identical. Since the misalignment in T1 and T2 transistor consists of a pre-set value and the misalignment error caused by the processing, a shift relative to zero value (the shift equal to the misalignment error) will occur. Since the misalignment error will be constant and in one direction within a die, this shift will be in the same direction for both T1 and T2 transistors: the value of the intersection on the abscissa will yield the actual misalignment error of the adjacent implanted regions in the test direction TD1, TD2 of the test structures.

Finally, it is noted that, preferably, in the test arrangement a second series of test structures is available which is oriented in a second test direction TD2 relative to the first series of test structures to evaluate the misalignment error in that second test direction. Preferably, the second test direction is perpendicular to the first test direction.

It is further noted that the isolation region STI may be omitted in structures as discussed above. Persons skilled in the art will appreciate that the effect used by the present invention will be present even if the STI is missing.

What is claimed is:

1. A test structure for testing misalignment between adjacent implanted regions of opposite conductivity type in a semiconductor device, said test structure (1) being arranged on a semiconductor substrate, comprising a first triple well-structure and a second triple well-structure, said second triple well-structure adjacent to said first triple well-structure in a first direction along the surface of said substrate, each triple well-structure comprising a lower buried n-well region, a high voltage p-well region, a p$^+$-region, a high voltage n-well region and a n$^+$-region, said lower buried n-well region being arranged on said semiconductor substrate, said high voltage p-well region being arranged on top of said buried n-well region, said p$^+$-region being arranged on top of said high voltage p-well region as emitter, said high voltage n-well region being arranged on top of said semiconductor substrate and laterally adjacent to said high voltage p-well region, said n$^+$-region being arranged on top of high voltage n-well region as base, characterized in that in said test structure a central portion of said base and a central portion of said high voltage n-well region are common to said first and said second triple well structure, said second triple well-structure being mirrored in said first direction relative to said first triple well-structure using said central portion of said base as a symmetry line running in a second direction perpendicular to said first direction, said symmetry line having a width and between said central portion of said base and said high voltage p-well region in said first triple well-structure a first overlay distance in said first direction is provided, and between said central portion of said base and said high voltage p-well region in said second triple well-structure a second overlay distance in said first direction is provided.

2. A test structure for testing misalignment between adjacent implanted regions of opposite conductivity type in a semiconductor device, according to claim 1, characterized in that said emitter of said first triple well-structure and said emitter of said second triple well structure have an substantially equal distance to said central portion of said base.

3. A test structure for testing misalignment between adjacent implanted regions of opposite conductivity type in a semiconductor device, according to claim 1, characterized in that in said second direction overlay of said high voltage p-well region and said high voltage n-well region is provided.

4. Test arrangement for testing misalignment between adjacent implanted regions of opposite conductivity type in a semiconductor device, comprising a first set of test structures according claim 1, characterized in that said first set being arranged for testing misalignment in a first test direction, said first test direction being substantially parallel to said first direction, said set comprises at least a first test structure, a second test structure and a third test structure, said first direction of each of said at least first test structure, second test structure and third test structure being substantially parallel to said first test direction, said first test structure having first values for said overlay distances, said second test structure having second values for said overlay distances, said third test structure having third values for said overlay distances.

5. Test arrangement for testing misalignment between adjacent implanted regions of opposite conductivity type in a semiconductor device, comprising a set of test structures according to claim 4, characterized in that said test arrangement comprises a second set of test structures, said second set comprising at least three further test structures, said second set being arranged for testing misalignment in a second test direction, said second test direction encompassing an angle with said first test direction, said first direction of each of said at least three further test structures being substantially parallel to said second test direction, each of said at least three further test structures having at least three further values for said overlay distances substantially similar to said values for said at least three test structures in said first set.

6. Test arrangement for testing misalignment between adjacent implanted regions of opposite conductivity type in a semiconductor device, comprising a set of test structures according to claim 5, characterized in that said angle between said first test direction and said second test direction is substantially 90°.

* * * * *